United States Patent
Pang et al.

(10) Patent No.: US 10,965,273 B2
(45) Date of Patent: Mar. 30, 2021

(54) WIDEBAND PIEZOELECTRIC FILTER WITH LADDER-STRUCTURE

(71) Applicant: ROFS Microsystem (Tianjin) Co., Ltd, Tianjin (CN)

(72) Inventors: Wei Pang, Tianjin (CN); Yunzhuo Zheng, Tianjin (CN)

(73) Assignee: ROFS Microsystem (Tianjin) Co., Ltd, Tianjin (CN)

(*) Notice: Subject to any disclaimer, the term of this patent is extended or adjusted under 35 U.S.C. 154(b) by 32 days.

(21) Appl. No.: 16/312,257

(22) PCT Filed: Jun. 21, 2016

(86) PCT No.: PCT/CN2016/086596
§ 371 (c)(1),
(2) Date: Dec. 20, 2018

(87) PCT Pub. No.: WO2017/219251
PCT Pub. Date: Dec. 28, 2017

(65) Prior Publication Data
US 2019/0341910 A1    Nov. 7, 2019

(51) Int. Cl.
*H03H 9/54* (2006.01)
*H03H 9/60* (2006.01)
(Continued)

(52) U.S. Cl.
CPC ............ *H03H 9/542* (2013.01); *H03H 9/171* (2013.01); *H03H 9/205* (2013.01); *H03H 9/605* (2013.01); *H03H 9/64* (2013.01)

(58) Field of Classification Search
CPC .......... H03H 9/542; H03H 9/64; H03H 9/605; H03H 9/205; H03H 9/171; H03H 9/6483
(Continued)

(56) References Cited

U.S. PATENT DOCUMENTS

| 7,619,494 B2 * | 11/2009 | Suzuki | H03H 9/568 333/133 |
| 2010/0188166 A1 * | 7/2010 | Hara | H03H 9/542 333/133 |
| 2016/0156328 A1 * | 6/2016 | Takeuchi | H03H 9/0009 333/124 |

FOREIGN PATENT DOCUMENTS

| CN | 1507152 A | 6/2004 |
| CN | 102055430 A | 5/2011 |

OTHER PUBLICATIONS

International Search Report of PCT Patent Application No. PCT/CN2016/086596 dated Mar. 1, 2017.

* cited by examiner

*Primary Examiner* — Robert J Pascal
*Assistant Examiner* — Jorge L Salazar, Jr.

(57) ABSTRACT

A wideband piezoelectric filter with a ladder-type is provided, which is composed of a plurality of first resonators connected in series, a plurality of second resonators connected in parallel, an impedance matching device disposed near the input terminal or the output terminal of the filter, and at least one special parallel ground path led out from serial nodes. The special parallel ground path at least comprises one inductor having a larger inductance value, and a resonator having the same resonant frequency as a serial branch or a capacitor, wherein the larger inductor is connected to the resonator or capacitor in series in the parallel path. The ladder filter according to the invention can have a bandwidth which is more than twice that of the conventional ladder filter, and also has excellent out-of-band rejection characteristics.

10 Claims, 12 Drawing Sheets

(51) Int. Cl.
*H03H 9/17* (2006.01)
*H03H 9/205* (2006.01)
*H03H 9/64* (2006.01)

(58) Field of Classification Search
USPC .................. 333/133, 187, 188, 193–196
See application file for complete search history.

Figure 11(a) (Prior Art)
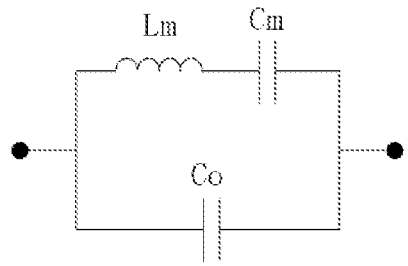
Figure 11(b) (Prior Art)
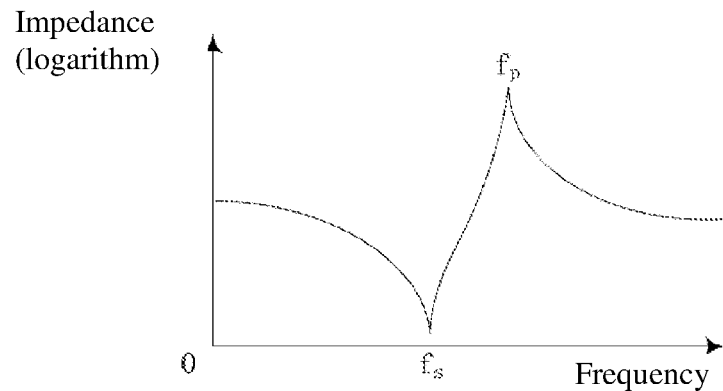
Figure 12 (Prior Art)
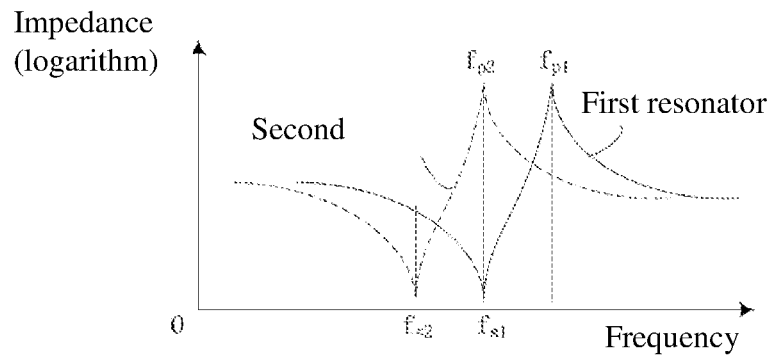
Figure 13 (a) (Prior Art)

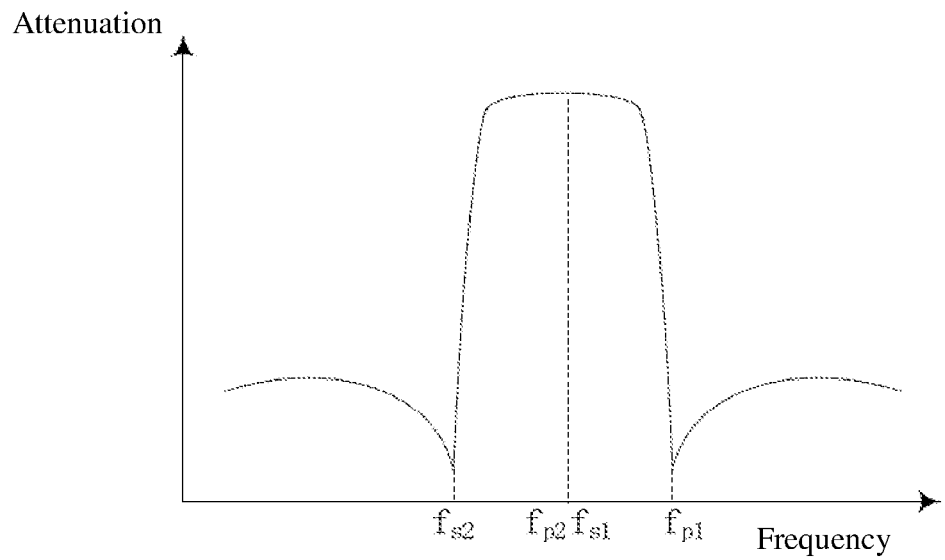
Figure 13 (b)   (Prior Art)
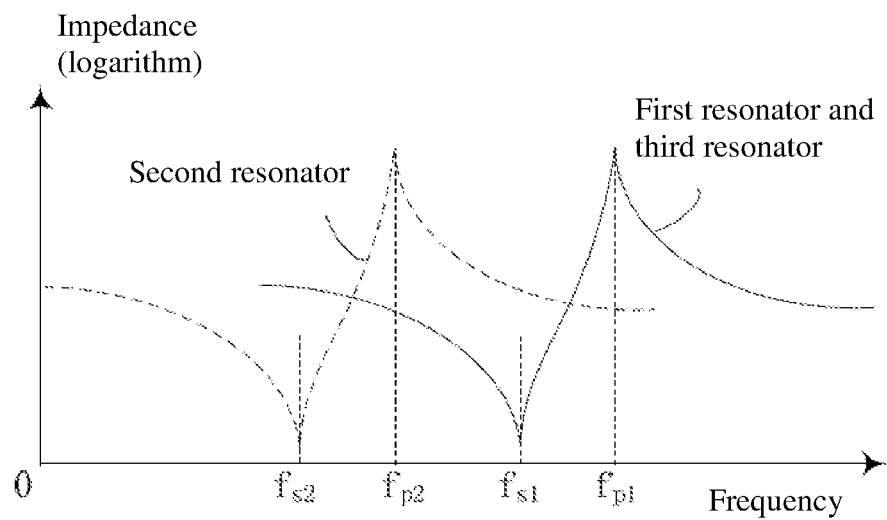
Figure 14

WIDEBAND PIEZOELECTRIC FILTER WITH LADDER-STRUCTURE

FIELD OF THE INVENTION

The invention relates to the field of filtering devices for communication, and in particular, to a piezoelectric filter manufactured based on the principle of the piezoelectric effect.

BACKGROUND OF THE INVENTION

With the rapid development of wireless communication terminals and devices, the frequency band partition for wireless communication becomes more and more complicated. Multimode and multi-band have become the mainstream trend of the development of the current wireless communication terminals. There is an increasingly growing demand for small-sized, lightweight, high-performance high-frequency filters without significant change in the size of the terminal.

At present, the small-sized intermediate frequency and radio-frequency filters used in communication terminals are mainly piezoelectric acoustic wave filters. Resonators constituting such acoustic wave filters mainly include a FBAR (Film Bulk Acoustic Resonator), a SMR (Solidly Mounted Resonators) and a SAW (Surface Acoustic Wave). The topological structures of the filter circuit designed using the resonators mainly include a ladder-type and a lattice-type. The ladder filter is mainly used for a single-ended (unbalanced) filter having a single input port and single output port, and the lattice structure is mainly used for a filter of which at least one end is a dual port/differential (balanced). Since it is more convenient to use single-ended filter in the radio-frequency chains, most of the high-performance acoustic filters and duplexers are designed in ladder-type.

FIG. 11 (a) shows electrical symbols of a piezoelectric acoustic resonator, FIG. 11 (b) is an equivalent circuit diagram of the piezoelectric acoustic resonator, and the electrical model is simplified to be a resonant circuit consisting of $L_m$, $C_m$ and $C_0$ without considering the loss. According to the resonance conditions, there are two resonant frequencies for the resonant circuit, that is, one is $f_s$ at which the impedance of the resonant circuit reaches the minimum, $f_s$ being defined as the series resonant frequency of the resonator, and the other is $f_p$, at which the impedance of the resonant circuit reaches the maximum, $f_p$ being defined as the parallel resonant frequency of the resonator, wherein, $$f_s = \frac{1}{2\pi\sqrt{L_m C_m}}, f_p = \frac{1}{2\pi\sqrt{L_m \frac{C_0 C_m}{C_0 + C_m}}}$$

In addition, $f_s$ is lower than $f_p$. Moreover, the effective electromechanical coupling coefficient ($Kt^2_{eff}$) of the resonator is defined, which can be expressed by $f_s$ and $f_p$:

$$Kt^2_{eff} = \frac{\pi/2 \cdot f_s/f_p}{\tan(\pi/2 \cdot f_s/f_p)}$$

FIG. 12 shows the relationship between the resonator impedance and $f_s$ and $f_p$. At a particular frequency, the greater the $Kt^2_{eff}$ is, the larger the frequency difference between $f_s$ and $f_p$ will be, that is, the further the distance between the two resonant frequencies will be.

FIG. 1 is a circuit diagram of a common ladder-type piezoelectric band-pass filter 100 in the prior art. 131 is an input terminal of the filter, and 132 is an output terminal of the filter. Between 131 and 132, there are a plurality of first resonators 101, 102, 103, 104 located in serial path and connected in series and a plurality of second resonators 111, 112, 113 located in parallel path and grounded in parallel with some of the nodes in the serial path. These first resonators have a first series resonant frequency $f_{s1}$ and a first parallel resonant frequency $f_{p1}$, and these second resonators have a second series resonant frequency $f_{s2}$ and a second parallel resonant frequency $f_{p2}$. Moreover, auxiliary inductors 121 and 122 are added in order to connect the first resonators to the input and output terminals of the filter, and auxiliary inductors 123, 124 and 125 are added in order to connect the second resonators to ground. These auxiliary inductors may be bonding wires for connecting the chip to the package carrier, or may also be metal conductors for flip-chip bonding the chip onto the package carrier, such as a copper pillar, a solder ball, and their inductance values are typically in a range from 0.1 nH to 2 nH, such as from 0.1 nH to 0.8 nH.

FIG. 13 (a) shows relationships among the first series resonant frequency $f_{s1}$ and the first parallel resonant frequency $f_{p1}$ of the first resonator and the second series resonant frequency $f_{s2}$ and the second parallel resonant frequency $f_{p2}$ of the second resonator in the prior art, that is, $f_{s1}<f_{p1}$, $f_{s2}<f_{p2}$, and $f_{s1}$ is approximately equal to $f_{p2}$. For the FBAR or SMR, a mass load can be added on the second resonator such that the first resonator and the second resonator can satisfy the above-described frequency characteristics. For the SAW, an interdigitated finger length, gap, distribution, thickness of transducers of the first resonator and the second resonator can be adjusted such that the first resonator and the second resonator satisfy the above-described frequency characteristics.

Thus, for the ladder-type filter 100, there are three representative frequencies. In the following, how the three special frequencies constitute a piezoelectric band-pass filter is illustrated according to impedance voltage divider. When the frequency is equal to $f_{p1}$, the impedance of the first resonator in the serial position reaches the maximum, and the impedance of the second resonator in the parallel position is much lower than the impedance of the first resonator. Most of the signals inflowing from the terminal 131 flows into the ground via the second resonator and cannot reach the terminal 132, and the filter 100 presents a characteristic of signal-blocking. When the frequency is equal to $f_{s1}$ or $f_{p2}$, the impedance of the first resonator in the serial position reaches the minimum, and the impedance of the second resonator in the parallel position reaches the maximum. Most of the signals inflowing from the terminal 131 flows through the serial path via the first resonator and reaches the terminal 132, and the filter 100 presents a characteristic of signal-passing. When the frequency is equal to $f_{s2}$, the impedance of the second resonator in the parallel position reaches the minimum, and the impedance of the first resonator in the serial position is much greater than the impedance of the second resonator. Most of the signals inflowing from the terminal 131 flows into the ground via the second resonator and cannot reach the terminal 132, and the filter 100 presents a characteristic of signal-blocking.

If the entire frequency band is analyzed in a similar way, an amplitude-frequency response curve of the filter 100 similar to FIG. 13 (b) can be obtained, the frequency band beyond $f_{s2}$ or $f_{p1}$ is the stop band of the filter, and the frequency band near $f_{s1}$ or $f_{p2}$ is the pass band of the filter.

As can be seen from the above description, the bandwidth of a ladder filter such as 100 depends mainly on the difference between the series resonant frequency and the parallel resonant frequency of the resonator contained in the filter, in other words, depends on the $Kt^2_{eff}$ of the resonator in the filter. In order to obtain a filter with a wider bandwidth, there is a need to improve the $Kt^2_{eff}$ of the resonator. However, the electromechanical coupling coefficient is related to many factors and cannot be increased unlimitedly according to the user's requirements. For example, a FBAR resonator that adopts Aluminum nitride (AlN) as a piezoelectric material has an $Kt^2_{eff}$ of up to about 7.2%, and the relative bandwidth of a band-pass filter that can be manufactured is typically up to about 4.5%.

However, in order to meet the requirements of high cell capacity and high data transmission rate for some communication frequency bands, a wider communication frequency band is required to be allocated. For example, the $41^{th}$ band (Band 41) allocated according to the 3GPP protocol has a pass-band range from 2496 MHz to 2690 MHz, with a bandwidth of 194 MHz, a relative bandwidth of up to 7.5%, and is also required to have a certain degree of suppression on the communication signals at the low frequency side, such as WLAN (from 2402.5 MHz to 2481.5 MHz), Band 40 (from 2300 MHz to 2400 MHz), etc. In this case, expanding the application bandwidth of the filter using the conventional method of increasing the electromechanical coupling coefficient is no longer effective, and there is a need for a special method to realize such band-pass filter with requirements of wide bandwidth and high rejection.

SUMMARY OF THE INVENTION

Since the conventional method of expanding the application bandwidth of the filter by increasing the electromechanical coupling coefficient cannot meet all the needs, a filter with an increased bandwidth is provided according to the present invention.

A filter is provided according to an embodiment of the invention, which comprises: a plurality of first resonators connected in series; a plurality of second resonators, each of which is connected between ground and one end of one of the plurality of first resonators; a bandwidth adjusting unit connected between the ground and a node between any two of the plurality of first resonators, wherein a parallel resonant frequency of the second resonator is lower than a series resonant frequency of the first resonator.

According to an embodiment of the invention, the bandwidth adjusting unit comprises a third resonator and a first inductor, and the third resonator is connected in series with the first inductor.

According to an embodiment of the invention, the bandwidth adjusting unit comprises a capacitor and a first inductor, and the capacitor is connected in series with the first inductor.

According to an embodiment of the invention, the bandwidth adjusting unit comprises a first inductor.

According to an embodiment of the invention, the difference between the series resonant frequencies of the second resonator and the first resonator is 30% to 80% of the pass-band width of the filter.

According to an embodiment of the invention, the third resonator has a different resonant frequency from that of the second resonator.

According to an embodiment of the invention, the third resonator has the same resonant frequency as that of the first resonator.

According to an embodiment of the invention, the third resonator has a resonant frequency close to that of the first resonator.

According to an embodiment of the invention, the capacitor in the bandwidth adjusting unit is integrated into a chip using a semiconductor process.

According to an embodiment of the invention, the capacitor is a discrete capacitor device disposed outside the chip and integrated in a package carrier, and the package carrier comprises the chip.

According to an embodiment of the invention, one end of the capacitor is connected to the node, and one end of the first inductor is connected to the ground; or one end of the capacitor is connected to the ground, and one end of the first inductor is connected to the node.

According to an embodiment of the invention, the first resonator is connected to an external signal port via a second inductor, and the second resonator is connected to the ground via a third inductor.

According to an embodiment of the invention, the second inductor and the third inductor comprise a bonding wire for connecting the chip to the package carrier, or a metal conductor for flip-chip bonding the chip onto the package carrier.

According to an embodiment of the invention, inductance values of the second inductor and the third inductor are both in a range from 0.1 nH to 2 nH.

According to an embodiment of the invention, the filter further comprises an impedance matching device connected between the ground and an input port or an output port of the filter.

According to an embodiment of the invention, the impedance matching device is a passive device comprising an inductor, a capacitor, and a transmission line, and the passive device is implemented by a bonding wire, an integrated passive device (IPD) component, and integrated or discrete devices on the package carrier.

According to an embodiment of the invention, an inductance value of the first inductor is in a range from 1 nH to 10 nH.

According to an embodiment of the invention, the resonators in the filter comprise a film bulk acoustic wave piezoelectric resonator (FBAR) having an air gap, a solidly mounted bulk acoustic wave piezoelectric resonator (SMR) having a Bragg acoustic reflector, or a surface acoustic wave piezoelectric resonator (SAWR) with an interdigital transducer (IDT).

For the filter according to the invention, the relative bandwidth of the filter is enlarged by adding a special parallel ground path under the conditions of neither changing the electromechanical coupling coefficient of the resonator, nor changing the complexity of the manufacturing process, and the filter has excellent out-of-band rejection characteristics, thus achieving the high-performance requirements on the piezoelectric filter.

BRIEF DESCRIPTION OF THE ACCOMPANYING DRAWINGS

The accompanying drawings are used for better understanding of the present invention, and do not improperly limit the present invention. In the drawings:

FIG. 11 (a) shows electrical symbols of a piezoelectric acoustic wave resonator;

FIG. 11 (b) is an equivalent electrical model diagram of the piezoelectric acoustic wave resonator;

FIG. 12 is a schematic diagram of the relationships among the resonator impedance, $f_s$ and $f_p$;

FIG. 13 (a) is a schematic diagram of the relationship between the resonant frequencies of the resonators of the ladder filter in the prior art;

FIG. 13 (b) is a schematic diagram of the relationship between the filter curve and the resonant frequencies of the ladder filter in the prior art;

FIG. 14 is a schematic diagram of the relationship between the resonant frequencies of the resonators in the ladder-type wideband filter according to the present invention;

DETAILED DESCRIPTION OF THE PREFERRED EMBODIMENTS

To solve the problems occurring in manufacturing a wideband piezoelectric filter in the prior art, a circuit structure that is different from the conventional ladder filter is provided according to the present invention, wherein the relative bandwidth of the filter is enlarged by adding a special parallel branch to ground under the conditions of neither changing the electromechanical coupling coefficient of the resonator nor changing the complexity of the manufacturing process, and meanwhile the filter has excellent out-of-band rejection characteristics, thus achieving the high-performance requirements on the piezoelectric filter. The filters according to embodiments of the present invention have a bandwidth which exceeds the limit bandwidth of the conventional ladder filter at least by 20%, and the out-of-band suppression does not significantly deteriorate; in particular, the out-of-band rejection at the low-frequency side of the pass band does not significantly deteriorate.

Figure 1:
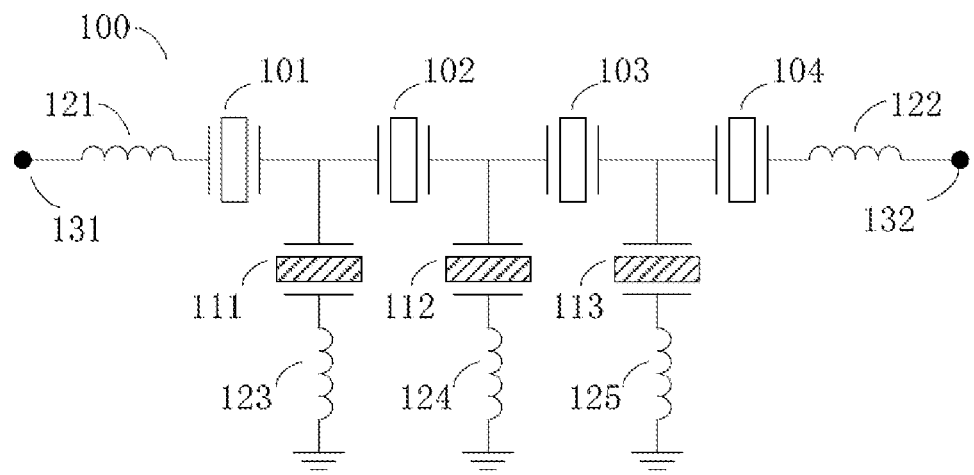
FIG. 1 is a schematic diagram showing a ladder-type commonly used in the design of existing single-ended band-pass filter.
Figure 2:
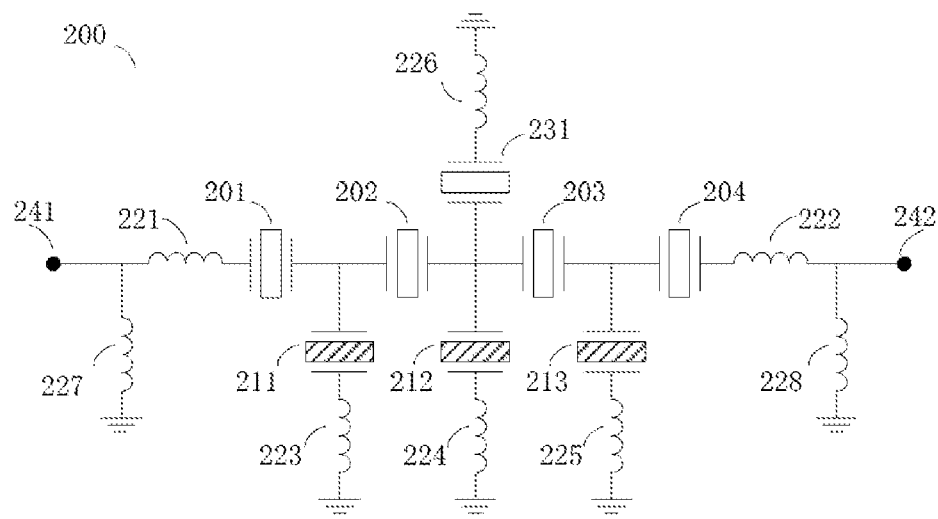
FIG. 2 is a schematic diagram showing a piezoelectric filter 200 with wideband and high rejection according to the present invention which is obtained through variations on the existing ladder filter.

FIG. 2 is a circuit diagram of an improved piezoelectric pass-band filter 200 based on the ladder filter in FIG. 1. 241 is an input terminal of the filter, 242 is an output terminal of the filter, and the input and output terminals are ports of external signals connected to the filter. Between the input terminal 241 and the output terminal 242, there are a plurality of first resonators 201, 202, 203, 204 located in the serial path and connected in series and a plurality of second resonators 211, 212, 213 located in the parallel path and led out and grounded from some nodes in the serial path. The first resonators 201, 202, 203, 204 have a first series resonant frequency $f_{s1}$ and a first parallel resonant frequency $f_{p1}$. One end of the second resonator 211 is connected to a node between the first resonator 201 and the first resonator 202, one end of the second resonator 212 is connected to a node between the first resonator 202 and the first resonator 203, and one end of the second resonator 213 is connected to a node between the first resonator 203 and the first resonator 204. The second resonators 211, 212, 213 have a second series resonant frequency $f_{s2}$ and a second parallel resonant frequency $f_{p2}$, and the relationship between the resonant frequencies of the first resonator and the second resonator is shown in FIG. 14, wherein $f_{p2}<f_{s1}$.

In addition, the filter 200 further includes a bandwidth adjusting unit, and the bandwidth adjusting unit includes a special parallel ground path. The special parallel ground path is led out from a node connected with the first resonators 202 and 203 in the serial path and is comprised of a third resonator 231 and a first inductor 226 connected in series and connected to the ground. The third resonator 231 has the same series resonant frequency as that of the first resonator, that is, the first series resonant frequency $f_{s1}$, and has the same parallel resonant frequency as that of the first resonator, that is, the first parallel resonant frequency $f_{p1}$. The first inductor 226 has a larger inductance value, typically between 1 nH and 10 nH. Auxiliary inductors 221 and 222 are added in order to connect the first resonator to the input and output terminals of the filter, and auxiliary inductors 223, 224, 225 are added in order to connect the second resonator to the ground (wherein "ground" in the present invention may also be referred to as "ground"). The auxiliary inductors may be bonding wires for connecting the chip to the package carrier, or may also be metal conductors for flip-chip bonding the chip onto the package carrier, such as a copper pillar, a solder ball. The auxiliary inductors 221, 222, 223, 224, 225 may also be referred to as second inductors, of which the inductance value is typically in a range from 0.1 nH to 2 nH, such as from 0.1 nH to 0.8 nH. That is, the inductance value of the first inductor is greater than the inductance value of the second inductor. In order to achieve excellent characteristics of the filter in the passband, a third inductor 227 for impedance matching is added near the input terminal 241, and a third inductor 228 for impedance matching is added near the output terminal 242. The impedance matching device for impedance matching is not limited to an inductor, and may further include other passive devices, such as a capacitor, a transmission line, etc. and the implementation of the passive devices includes, but is not limited to, a bonding wire, an integrated passive device (IPD) component, and integrated or discrete devices on the package carrier.

FIG. 15(a)-15(d) are diagrams of an amplitude-frequency response curve of insertion loss and return loss of the filter 200. FIG. 15 (a) is a curve of the insertion loss of the filter in wideband, FIG. 15 (b) is a curve of the insertion loss of the filter in pass band, FIG. 15 (c) is a curve of the return loss of the filter input port, and FIG. 15 (d) is a curve of the return loss of the filter output port. The center frequency point of the filter is 2 GHz, the 3 dB bandwidth is up to 124 MHz, and the relative bandwidth is up to 6.25%. If the same resonators and the conventional ladder-type circuit are used, the 3 dB bandwidth can only be 70 MHz, that is, the relative bandwidth is about 4%. In contrast, at the same time of increasing the bandwidth of the filter 200 by using the third resonator 231 and the first inductor 226, the return loss is also maintained to be better than −10 dB and the out-of-band rejection at the low-frequency side of the pass band is above 33 dB without significant deterioration, which can not only meet the requirements of wideband communications, but also can play a better rejection role on the out-of-band interference signals. Therefore, with the filter 200 of the invention, the out-of-band rejection does not significantly deteriorate; in particular, the out-of-band rejection at the low-frequency side of the pass band does not significantly deteriorate.

For the filter 200 according to an embodiment of the present invention, the relative bandwidth of the filter is enlarged by adding a special parallel ground path without changing the electromechanical coupling coefficient of the resonator or changing the complexity of the manufacturing process, and the filter has excellent out-of-band rejection characteristics, thus achieving the high-performance requirements on the piezoelectric filter. The filters according to embodiments of the present invention have a bandwidth which exceeds the limit bandwidth of the conventional ladder filter at least by 20%, and the out-of-band rejection does not significantly deteriorate; in particular, the out-of-band rejection at the low-frequency side of the pass band does not significantly deteriorate.

Figure 3:
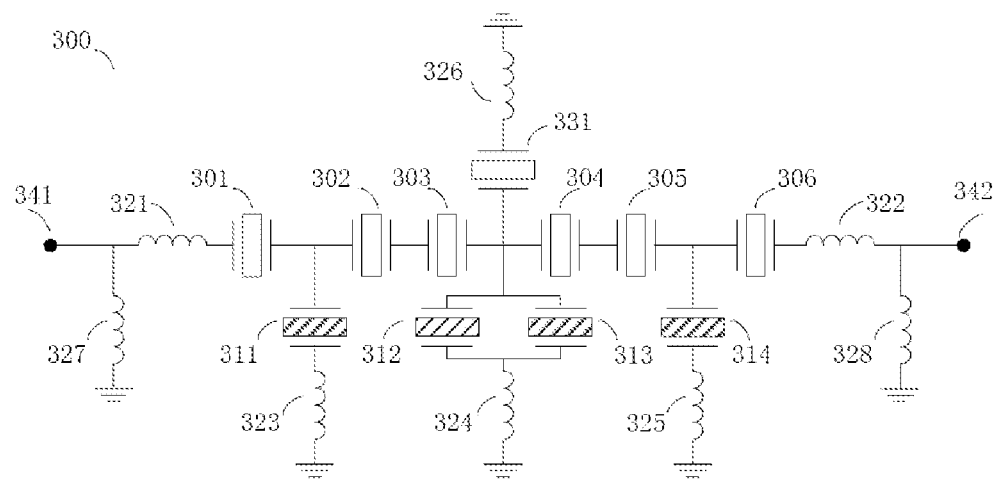
FIG. 3 is a schematic diagram showing a filter 300 according to an embodiment of the present invention.

FIG. 3 is a schematic diagram showing a filter 300 according to an embodiment of the present invention. 341 is an input terminal of the filter, and 342 is an output terminal of the filter. Between the input terminal 341 and the output terminal 342, there are a plurality of first resonators 301, 302, 303, 304, 305, 306 located in the serial path and connected in series and a plurality of second resonators 311, 312, 313, 314 located in the parallel path and grounded in parallel from some nodes in the serial path. The first resonators 301, 302, 303, 304, 305, 306 have a first series resonant frequency $f_{s1}$ and a first parallel resonant frequency $f_{p1}$. One end of the second resonator 311 is connected to a node between the first resonator 301 and the first resonator 302, one end of the second resonator 312 and one end of the second resonator 313 are connected together and connected to a node between the first resonator 303 and the first resonator 304, and one end of the second resonator 314 is connected to a node between the first resonator 305 and the first resonator 306. The second resonators 311, 312, 313, 314 have a second series resonant frequency $f_{s2}$ and a second parallel resonant frequency $f_{p2}$, and the relationship between the resonant frequencies of the first resonator and the second resonator is shown in FIG. 14, wherein $f_{p2}<f_{s1}$.

In addition, the filter 300 further includes a bandwidth adjusting unit, and the bandwidth adjusting unit includes a special parallel ground path. The special parallel ground path is led out from a node connected with the first resonators 303 and 304 in the serial path and is comprised of a third resonator 331 and a first inductor 326 connected in series and connected to the ground. The third resonator 331 has the same series resonant frequency as that of the first resonator, that is, the first series resonant frequency $f_{s1}$, and has the same parallel resonant frequency as that of the first resonator, that is, the first parallel resonant frequency $f_{p1}$. The first inductor 326 has a larger inductance value, typically between 1 nH and 10 nH. Auxiliary inductors 321 and 322 are added in order to connect the first resonator to the input and output terminals of the filter, auxiliary inductors 323, 324, 325 are added in order to connect the second resonator to the ground, and the other ends of the second resonators 312 and 313 are connected together and connected to the ground via the auxiliary inductor 324. The auxiliary inductors may be bonding wires for connecting the chip to the package carrier, or may also be metal conductors for flip-chip bonding the chip onto the package carrier, such as a copper pillar and a solder ball. The auxiliary inductors 321, 322, 323, 324, 325 may also be referred to as a second inductor, of which the inductance value is typically in a range from 0.1 nH to 2 nH, such as from 0.1 nH to 0.8 nH. That is, the inductance value of the first inductor is greater than the inductance value of the second inductor. In order to achieve excellent characteristics of the filter in the pass-band range, a third inductor 327 for impedance matching is added near the input terminal 341, a third inductor 328 for impedance matching is added near the output terminal 342, and the device for impedance matching in the filter 300 is similar to the impedance matching device in the filter 200, which will not be repeated any more herein. Moreover, with the filter 300 according to an embodiment of the present invention, the relative bandwidth of the filter is enlarged by adding a special parallel ground path under the conditions of neither changing the electromechanical coupling coefficient of the resonator nor changing the complexity of the manufacturing process, and the filter has excellent out-of-band rejection characteristics, thus achieving the high-performance requirements on the piezoelectric filter.

Figure 4:
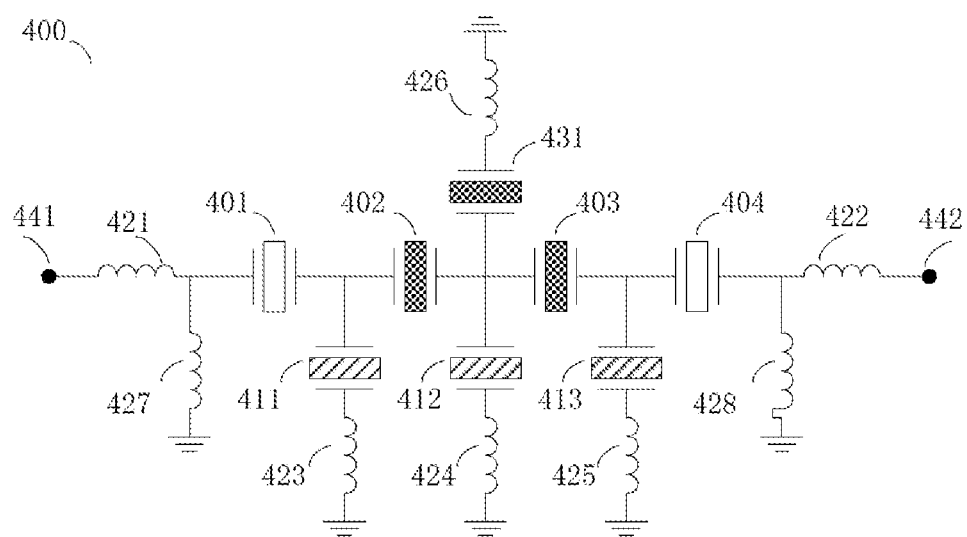
FIG. 4 is a schematic diagram showing a filter 400 according to another embodiment of the present invention.

FIG. 4 is a schematic diagram showing a filter 400 according to another embodiment of the present invention. 441 is an input terminal of the filter, and 442 is an output terminal of the filter. Between the input terminal 441 and the output terminal 442, there are a plurality of first resonators 401, 404 and third resonators 402, 403 located in the serial path and connected in series and a plurality of second resonators 411, 412, 413 located in the parallel path and grounded in parallel from some nodes in the serial path. The third resonators 402, 403 are connected in series between the first resonator 401 and the first resonator 404, and the first resonators 401, 404 have a first series resonant frequency $f_{s1}$ and a first parallel resonant frequency $f_{p1}$. One end of the second resonator 411 is connected to a node between the first resonator 401 and the third resonator 402, one end of the second resonator 412 is connected to a node between the third resonator 402 and 403, and one end of the second resonator 413 is connected to a node between the third resonator 403 and the first resonator 404. The second resonators 411, 412, 413 have a second series resonant frequency $f_{s2}$ and a second parallel resonant frequency $f_{p2}$.

Figure 17:
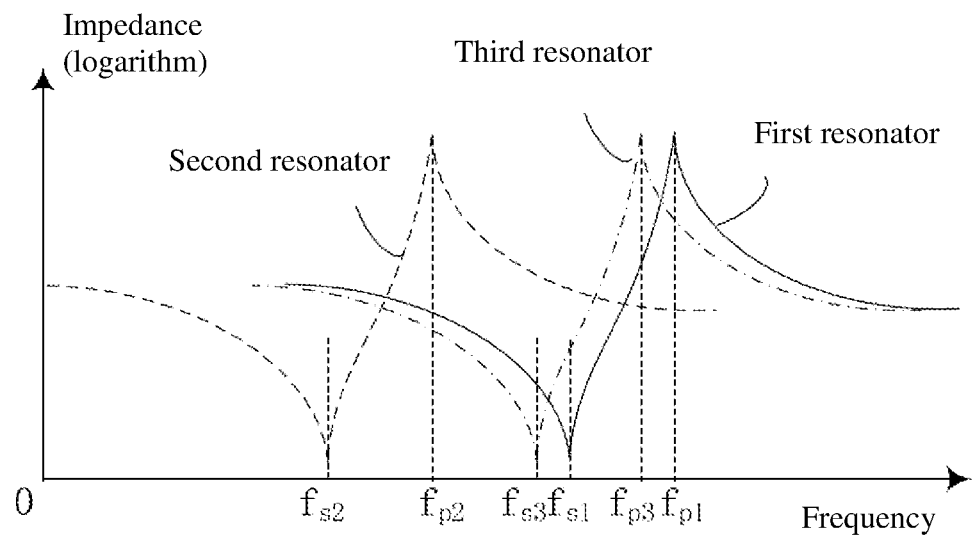
FIG. 17 is a schematic diagram of the relationship between the resonant frequencies of the resonators in the filter 400.

In addition, the filter 400 further includes a bandwidth adjusting unit, and the bandwidth adjusting unit includes a special parallel ground path. The special parallel ground path is led out from a node connected with the third resonators 402 and 403 in the serial path and is comprised of a third resonator 431 and a first inductor 426 connected in series and connected to the ground. The third resonator 402, 403, 431 have a third series resonant frequency $f_{s3}$ and a third parallel resonant frequency $f_{p3}$. The relationships among the resonant frequencies of the first, second and third resonators are shown in FIG. 17, wherein $f_{p2}<f_{s3}<f_{s1}$. The first inductor 426 has a larger inductance value, typically between 1 nH and 10 nH. Auxiliary inductors 421 and 422 are added in order to connect the first resonator to the input and output terminals of the filter, auxiliary inductors 423, 424, 425 are added in order to connect the second resonator to the ground. The auxiliary inductors may be bonding wires for connecting the chip to the package carrier, or may also be metal conductors for flip-chip bonding the chip onto the package carrier, such as a copper pillar and a solder ball. The auxiliary inductors 421, 422, 423, 424, 425 may also be referred to as a second inductor, of which the inductance value is typically in a range from 0.1 nH to 2 nH, such as from 0.1 nH to 0.8 nH. That is, the inductance value of the first inductor is greater than the inductance value of the second inductor. In order to achieve excellent characteristics of the filter in the pass-band range, a third inductor 427 for impedance matching is added near the input terminal 441, a third inductor 428 for impedance matching is added near the output terminal 442. The third inductors 427 and 428 are located near the input terminal and the output terminal, instead of being directly connected to the input terminal and the output terminal. Specifically, the third inductors 427 and 428 are connected to the resonators, and the third inductors 427 and 428 may be passive devices on an integrated chip, such as an IPD. Moreover, with the filter 400 according to an embodiment of the present invention, the relative bandwidth of the filter is enlarged by adding a special parallel ground path under the conditions of neither changing the electromechanical coupling coefficient of the resonator nor changing the complexity of the manufacturing process, and the filter has excellent out-of-band rejection characteristics, thus achieving the high-performance requirements on the piezoelectric filter.

Figure 5:
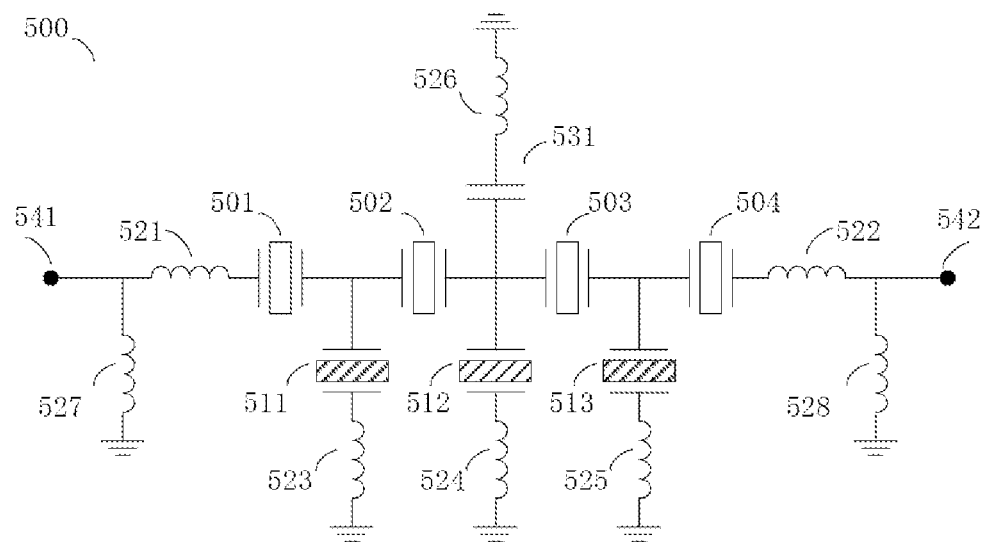
FIG. 5 is a schematic diagram showing a filter 500 according to another embodiment of the present invention.

FIG. 5 is a schematic diagram showing a filter 500 according to another embodiment of the present invention. 541 is an input terminal of the filter, and 542 is an output terminal of the filter. Between the input terminal 541 and the output terminal 542, there are a plurality of first resonators 501, 502, 503, 504 located in the serial path and connected in series and a plurality of second resonators 511, 512, 513 located in the parallel path and grounded in parallel from some nodes in the serial path. The first resonators 501, 502, 503, 504 have a first series resonant frequency $f_{s1}$ and a first parallel resonant frequency $f_{p1}$. The second resonators 511, 512, 513 have a second series resonant frequency $f_{s2}$ and a second parallel resonant frequency $f_{p2}$. The relationship between the resonant frequencies of the first resonator and the second resonator is shown in FIG. 14, wherein $f_{p2}<f_{s1}$. One end of the second resonator 511 is connected to a node between the first resonator 501 and the first resonator 502, one end of the second resonator 512 is connected to a node between the first resonator 502 and the first resonator 503, and one end of the second resonator 513 is connected to a node between the first resonator 503 and the first resonator 504.

In addition, the filter 500 further includes a bandwidth adjusting unit, and the bandwidth adjusting unit includes a special parallel ground path. The special parallel ground path is led out from a node connected with the first resonators 502 and 503 in the serial path and is comprised of a capacitor 531 and a first inductor 526 connected in series and connected to the ground. The capacitor 531 may be integrated into a chip using a semiconductor process, and the capacitor 531 may be separated from the chip, for example, a discrete capacitor device may be used, or the capacitor 531 may be integrated into the package carrier using other processes. The orders of signals flowing via the capacitor 531 and the first inductor 526 in the special parallel ground path are interchangeable. The first inductor 526 has a larger inductance value, typically between 1 nH and 10 nH. Auxiliary inductors 521 and 522 are added in order to connect the first resonator to the input and output terminals of the filter, and auxiliary inductors 523, 524, 525 are added in order to connect the second resonator to the ground. The auxiliary inductors may be bonding wires for connecting the chip to the package carrier, or may also be metal conductors for flip-chip bonding the chip onto the package carrier, such as a copper pillar and a solder ball. The auxiliary inductors 521, 522, 523, 524, 525 may also be referred to as a second inductor, of which the inductance value is typically in a range from 0.1 nH to 2 nH, such as from 0.1 nH to 0.8 nH. That is, the inductance value of the first inductor is greater than the inductance value of the second inductor. In order to achieve excellent characteristics of the filter throughout the pass-band range, a third inductor 527 for impedance matching is added near the input terminal 541, a third inductor 528 for impedance matching is added near the output terminal 542, and the device for impedance matching in the filter 500 is similar to the impedance matching device in the filter 200, which will not be repeated any more herein. Moreover, with the filter 500 according to an embodiment of the present invention, the relative bandwidth of the filter is enlarged by adding a special parallel ground path under the conditions of neither changing the electromechanical coupling coefficient of the resonator nor changing the complexity of the manufacturing process, and the filter has excellent out-of-band rejection characteristics, thus achieving the high-performance requirements on the piezoelectric filter.

Figure 6:
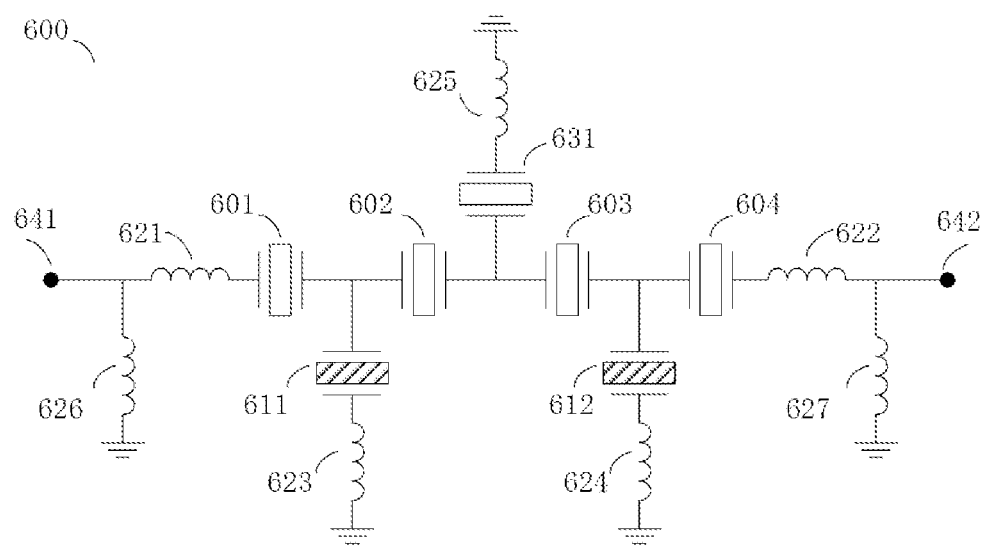
FIG. 6 is a schematic diagram showing a filter 600 according to another embodiment of the present invention.

FIG. 6 is a schematic diagram showing a filter 600 according to another embodiment of the present invention. 641 is an input terminal of the filter, and 642 is an output terminal of the filter. Between the input terminal 641 and the output terminal 642, there are a plurality of first resonators 601, 602, 603, 604 located in the serial path and connected in series and a plurality of second resonators 611, 612 located in the parallel path and grounded in parallel from some nodes in the serial path. The first resonators 601, 602, 603, 604 have a first series resonant frequency $f_{s1}$ and a first parallel resonant frequency $f_{p1}$. The second resonators 611, 612 have a second series resonant frequency $f_{s2}$ and a second parallel resonant frequency $f_{p2}$. The relationship between the resonant frequencies of the first resonator and the second resonator is shown in FIG. 14, wherein $f_{p2}<f_{s1}$. One end of the second resonator 611 is connected to a node between the first resonator 601 and the first resonator 602, and one end of the second resonator 612 is connected to a node between the first resonator 603 and the first resonator 604.

In addition, the filter 600 further includes a bandwidth adjusting unit, and the bandwidth adjusting unit includes a special parallel ground path. The special parallel ground path is led out from a node between the first resonators 602 and 603 in the serial path and is comprised of a third resonator 631 and a first inductor 625 connected in series and connected to the ground. The third resonator 631 has the same series resonant frequency as that of the first resonator, that is, the first series resonant frequency $f_{s1}$, and has the same parallel resonant frequency as that of the first resonator, that is, the first parallel resonant frequency $f_{p1}$. The first inductor 625 has a larger inductance value, typically between 1 nH and 10 nH. Auxiliary inductors 621 and 622 are added in order to connect the first resonator to the input and output terminals of the filter, and auxiliary inductors 623, 624 are added in order to connect the second resonator to the ground. The auxiliary inductors may be bonding wires for connecting the chip to the package carrier, or may also be metal conductors for flip-chip bonding the chip onto the package carrier, such as a copper pillar and a solder ball. The auxiliary inductors 621, 622, 623, 624 may also be referred to as a second inductor, of which the inductance value is typically in a range from 0.1 nH to 2 nH, such as from 0.1 nH to 0.8 nH. That is, the inductance value of the first inductor is greater than the inductance value of the second inductor. In order to achieve excellent characteristics of the filter throughout the pass-band range, a third inductor 626 for impedance matching is added near the input terminal 641, a third inductor 627 for impedance matching is added near the output terminal 642, and the device for impedance matching in the filter 600 is similar to the impedance matching device in the filter 200, which will not be repeated any more herein. Moreover, with the filter 600 according to an embodiment of the present invention, the relative bandwidth of the filter is enlarged by adding a special parallel ground path under the conditions of neither changing the electromechanical coupling coefficient of the resonator nor changing the complexity of the manufacturing process, and the filter has excellent out-of-band rejection characteristics, thus achieving the high-performance requirements on the piezoelectric filter.

Figure 7:
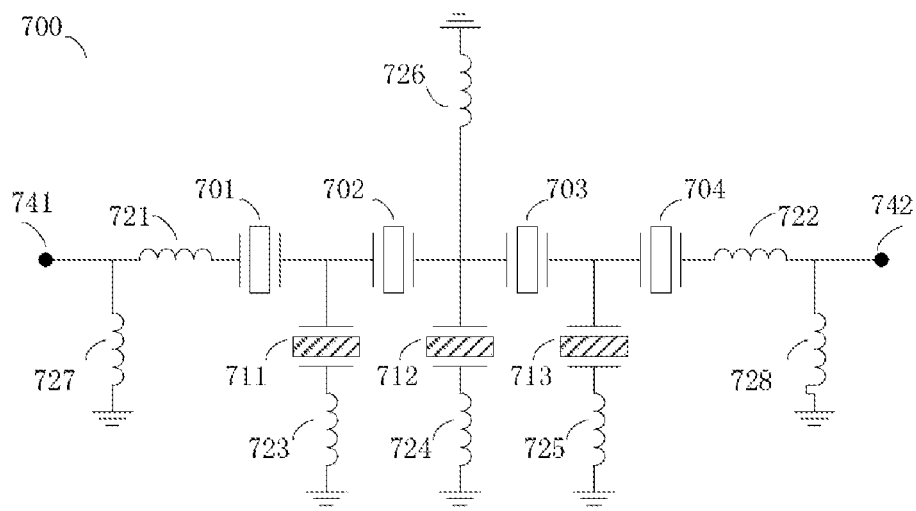
FIG. 7 is a schematic diagram showing a filter 700 according to another embodiment of the present invention.

FIG. 7 is a schematic diagram showing a filter 700 according to another embodiment of the present invention. 741 is an input terminal of the filter, and 742 is an output terminal of the filter. Between the input terminal 741 and the output terminal 742, there are a plurality of first resonators 701, 702, 703, 704 located in the serial path and connected in series and a plurality of second resonators 711, 712, 713 located in the parallel path and grounded in parallel from some nodes in the serial path. The first resonators 701, 702, 703, 704 have a first series resonant frequency $f_{s1}$ and a first parallel resonant frequency $f_{p1}$. The second resonators 711, 712, 713 have a second series resonant frequency $f_{s2}$ and a second parallel resonant frequency $f_{p2}$. The relationship between the resonant frequencies of the first resonator and the second resonator is shown in FIG. 14, wherein $f_{p2}<f_{s1}$. One end of the second resonator 711 is connected to a node between the first resonator 701 and the first resonator 702, one end of the second resonator 712 is connected to a node between the first resonator 702 and the first resonator 703, and one end of the second resonator 713 is connected to a node between the first resonator 703 and the first resonator 704.

In addition, the filter 700 further includes a bandwidth adjusting unit, and the bandwidth adjusting unit includes a special parallel ground path. The special parallel ground path is led out from a node connected with the first resonators 702 and 703 in the serial path, comprises a first inductor 726 and is connected to the ground. The first inductor 726 has a larger inductance value, typically between 1 nH and 10 nH. Auxiliary inductors 721 and 722 are added in order to connect the first resonator to the input and output terminals of the filter, and auxiliary inductors 723, 724, 725 are added in order to connect the second resonator to the ground. The auxiliary inductors may be bonding wires for connecting the chip to the package carrier, or may also be metal conductors for flip-chip bonding the chip onto the package carrier, such as a copper pillar and a solder ball. The auxiliary inductors 721, 722, 723, 724, 725 may also be referred to as a second inductor, of which the inductance value is typically in a range from 0.1 nH to 2 nH, such as from 0.1 nH to 0.8 nH. That is, the inductance value of the first inductor is greater than the inductance value of the second inductor. In order to achieve excellent characteristics of the filter throughout the pass-band range, a third inductor 727 for impedance matching is added near the input terminal 741, a third inductor 728 for impedance matching is added near the output terminal 742, and the device for impedance matching in the filter 700 is similar to the impedance matching device in the filter 200, which will not be repeated any more herein. Moreover, with the filter 700 according to an embodiment of the present invention, the relative bandwidth of the filter is enlarged by adding a special parallel ground path under the conditions of neither changing the electromechanical coupling coefficient of the resonator nor changing the complexity of the manufacturing process, and the filter has excellent out-of-band rejection characteristics, thus achieving the high-performance requirements on the piezoelectric filter.

Figure 8:
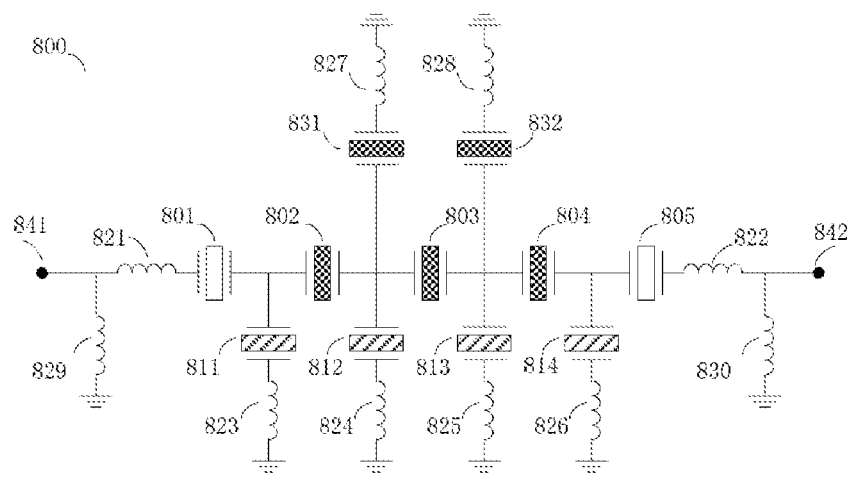
FIG. 8 is a schematic diagram showing a filter 800 according to another embodiment of the present invention.

FIG. 8 is a schematic diagram showing a filter 800 according to another embodiment of the present invention. 841 is an input terminal of the filter, and 842 is an output terminal of the filter. Between the input terminal 841 and the output terminal 842, there are a plurality of first resonators 801, 805 and third resonators 802, 803, 804 located in the serial path and connected in series and a plurality of second resonators 811, 812, 813, 814 located in the parallel path and grounded in parallel from some nodes in the serial path. The third resonators 802, 803, 804 are connected in series between the first resonator 801 and the first resonator 805, and the first resonators 801, 805 have a first series resonant frequency $f_{s1}$ and a first parallel resonant frequency $f_{p1}$. The second resonators 811, 812, 813, 814 have a second series resonant frequency $f_{s2}$ and a second parallel resonant frequency $f_{p2}$ One end of the second resonator 811 is connected to a node between the first resonator 801 and the third resonator 802, one end of the second resonator 812 is connected to a node between the third resonators 802 and 803, one end of the second resonator 813 is connected to a node between the third resonators 803 and 804, and one end of the second resonator 814 is connected to a node between the third resonator 804 and the first resonator 805.

In addition, the filter 800 further includes a bandwidth adjustment unit, and the bandwidth adjustment unit includes special parallel ground paths. The special parallel ground paths are led out from a node connected with the third resonators 802 and 803 and a node connected with the third resonators 803 and 804 in the serial path, one of the special parallel ground paths is comprised of a third resonator 831 and a first inductor 827 connected in series and connected to the ground, and the other of the special parallel ground paths is comprised of a third resonator 832 and a first inductor 828 connected in series and connected to the ground. The third resonators 802, 803, 804, 831, 832 have a third series resonant frequency $f_{s3}$ and a third parallel resonant frequency $f_{p3}$. The relationships among the resonant frequencies of the first, second and third resonators are shown in FIG. 17, wherein $f_{p2}<f_{p3}<f_{s1}$. The first inductors 827, 828 have a larger inductance value, typically between 1 nH and 10 nH. Auxiliary inductors 821 and 822 are added in order to connect the first resonator to the input and output terminals of the filter, and auxiliary inductors 823, 824, 825, 826 are added in order to connect the second resonator to the ground. The auxiliary inductors may be bonding wires for connecting the chip to the package carrier, or may also be metal conductors for flip-chip bonding the chip onto the package carrier, such as a copper pillar and a solder ball. The auxiliary inductors 821, 822, 823, 824, 825, 826 may also be referred to as a second inductor, of which the inductance value is typically in a range from 0.1 nH to 2 nH, such as from 0.1 nH to 0.8 nH. That is, the inductance value of the first inductor is greater than the inductance value of the second inductor. In order to achieve excellent characteristics of the filter in the pass-band range, a third inductor 829 for impedance matching is added near the input terminal 841, a third inductor 830 for impedance matching is added near the output terminal 842, and the device for impedance matching in the filter 800 is similar to the impedance matching device in the filter 200, which is not repeated any more herein. Moreover, with the filter 800 according to an embodiment of the present invention, the relative bandwidth of the filter is enlarged by adding special parallel ground paths under the conditions of neither changing the electromechanical coupling coefficient of the resonator nor changing the complexity of the manufacturing process, and the filter has excellent out-of-band rejection characteristics, thus achieving the high-performance requirements on the piezoelectric filter.

Figure 9:
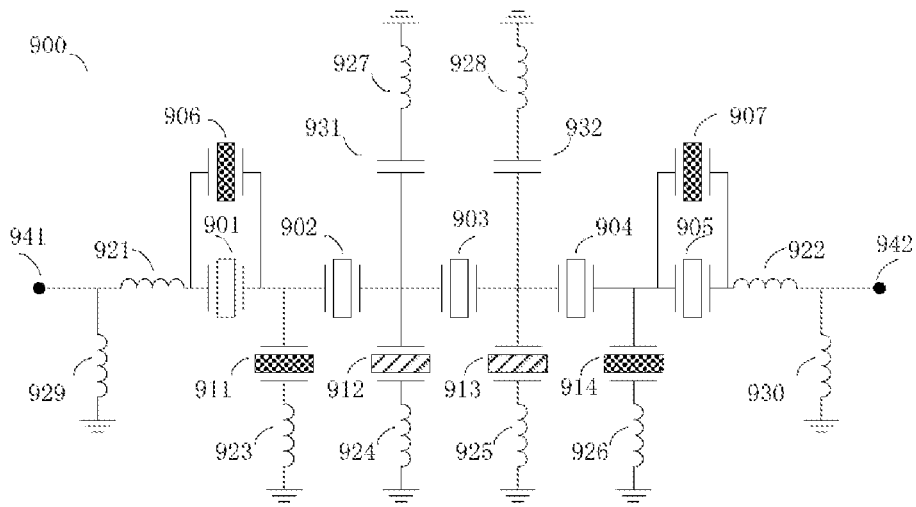
FIG. 9 is a schematic diagram showing a filter 900 according to another embodiment of the present invention.
Figure 18:
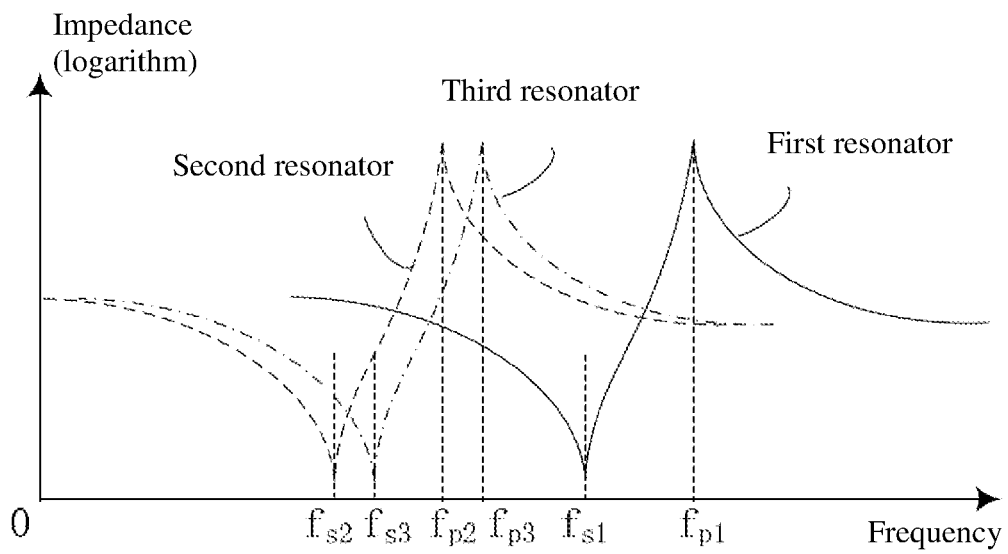
FIG. 18 is a schematic diagram of the relationship between the resonant frequencies of the resonators in the filter 900.

FIG. 9 is a schematic diagram showing a filter 900 according to another embodiment of the present invention. 941 is an input terminal of the filter, and 942 is an output terminal of the filter. Between the input terminal 941 and the output terminal 942, there are a plurality of first resonators 901, 902, 903, 904, 905 located in the serial path and connected in series and a plurality of second resonators 912, 913 and third resonators 911, 914 located in the parallel path and grounded in parallel from some nodes in the serial path. The first resonators 901, 902, 903, 904, 905 have a first series resonant frequency $f_{s1}$ and a first parallel resonant frequency $f_{p1}$. The second resonators 912, 913 have a second series resonant frequency $f_{s2}$ and a second parallel resonant frequency $f_{p2}$. In addition, third resonators 906, 907 are respectively connected in parallel with the first resonators 901, 905, and the third resonators 906, 907, 911, 914 have a third series resonant frequency $f_{p1}$ and a third parallel resonant frequency $f_{p1}$. The relationships among the resonant frequencies of the first, second, and third resonators are shown in FIG. 18, wherein $f_{p2}<f_{p3}<f_{s1}$. One end of the third resonator 911 is connected to a node between the first resonators 901 and 902, one end of the second resonator 912 is connected to a node between the first resonators 902 and 903, one end of the second resonator 913 is connected to a node between the first resonators 903 and 904, and one end of the third resonator 914 is connected to a node between the first resonators 904 and 905.

In addition, the filter 900 further includes a bandwidth adjustment unit, and the bandwidth adjustment unit includes special parallel ground paths. The special parallel ground paths are led out from a node connected with the first resonators 902 and 903 and a node connected with the first resonators 903 and 904 in the serial path, one of the special parallel ground paths is comprised of a capacitor 931 and a first inductor 927 connected in series and connected to the ground, and the other of the special parallel ground paths is comprised of a capacitor 932 and a first inductor 928 connected in series and connected to the ground. The capacitors 931, 932 may be integrated into a chip using a semiconductor process, and the capacitors 931, 932 may be separated from the chip, for example, a discrete capacitor device may be used, or the capacitors 931, 932 may be integrated into the package carrier using other processes. The orders of signals flowing via the capacitor 931 and the first inductor 927 and the orders of signals flowing via the capacitor 932 and the first inductor 928 in the special parallel ground paths are interchangeable. The first inductors 927, 928 have a larger inductance value, typically between 1 nH and 10 nH. Auxiliary inductors 921 and 922 are added in order to connect the first resonator to the input and output terminals of the filter, and auxiliary inductors 923, 924, 925, 926 are added in order to connect the second resonators 912, 913 and the third resonators 911, 914 to the ground. The auxiliary inductors may be bonding wires for connecting the chip to the package carrier, or may also be metal conductors for flip-chip bonding the chip onto the package carrier, such as a copper pillar and a solder ball. The auxiliary inductors 921, 922, 923, 924, 925, 926 may also be referred to as a second inductor, of which the inductance value is typically in a range from 0.1 nH to 2 nH, such as from 0.1 nH to 0.8 nH. That is, the inductance value of the first inductor is greater than the inductance value of the second inductor. In order to achieve excellent characteristics of the filter throughout the pass-band range, a third inductor 929 for impedance matching is added near the input terminal 941, a third inductor 930 for impedance matching is added near the output terminal 942, and the device for impedance matching in the filter 900 is similar to the impedance matching device in the filter 200, which will not be repeated any more herein. Moreover, with the filter 900 according to an embodiment of the present invention, the relative bandwidth of the filter is enlarged by adding special parallel ground paths under the conditions of neither changing the electromechanical coupling coefficient of the resonator nor changing the complexity of the manufacturing process, and the filter has excellent out-of-band rejection characteristics, thus achieving the high-performance requirements of the piezoelectric filter.

Figure 10:
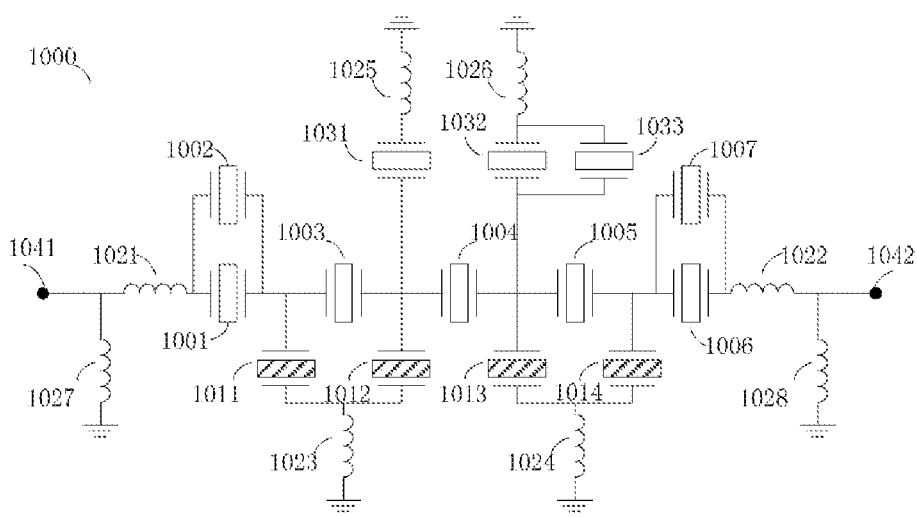
FIG. 10 is a schematic diagram showing a filter 1000 according to another embodiment of the present invention.
Figure 15A:
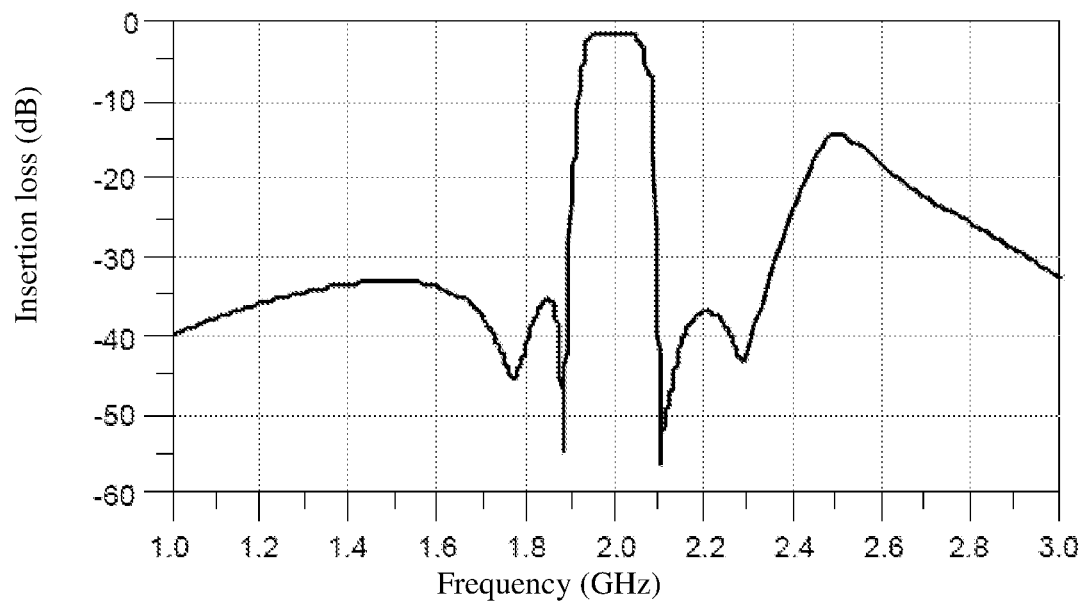
FIG. 15 (a) is a curve of the insertion loss of the filter in wideband, FIG. 15 (b) is a curve of the insertion loss of the filter in pass band, FIG. 15 (c) is a curve of the return loss of the filter input port, and FIG. 15 (d) is a curve of the return loss of the filter output port.
Figure 15B:
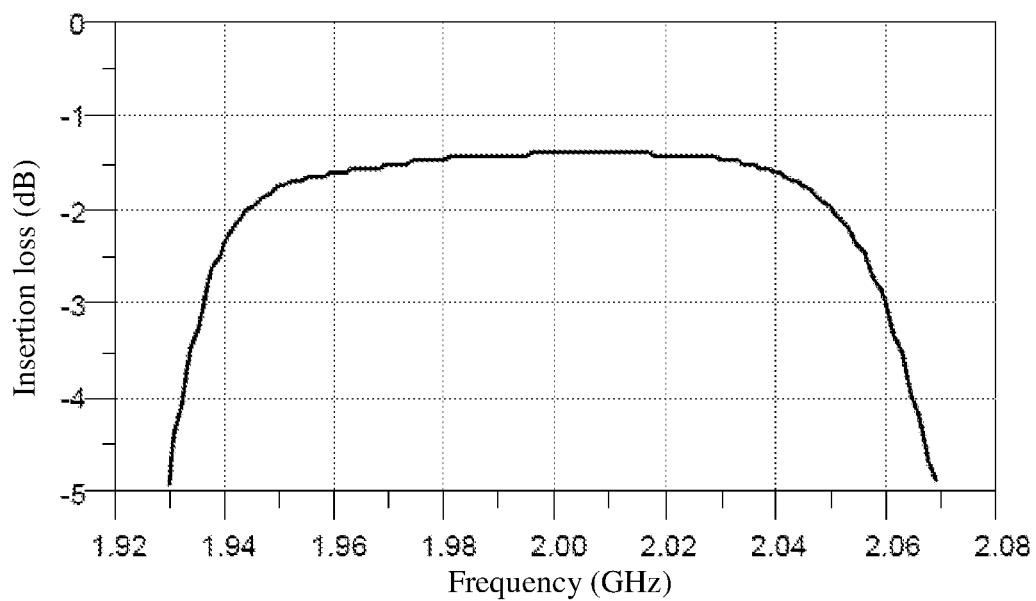
Figure 15C:
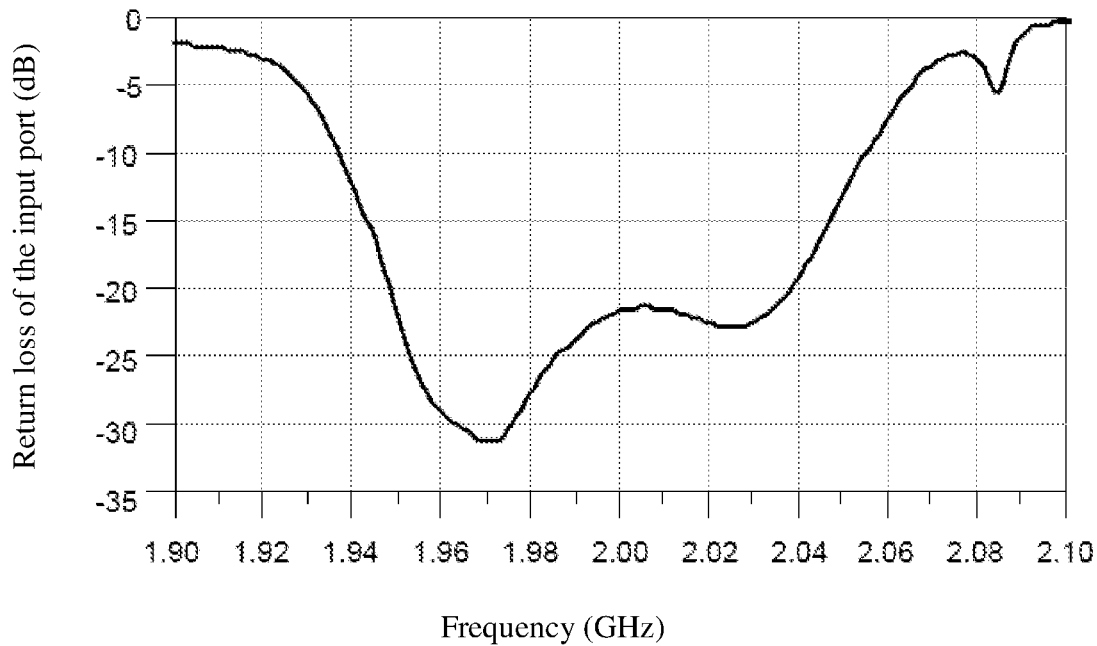
Figure 15D:
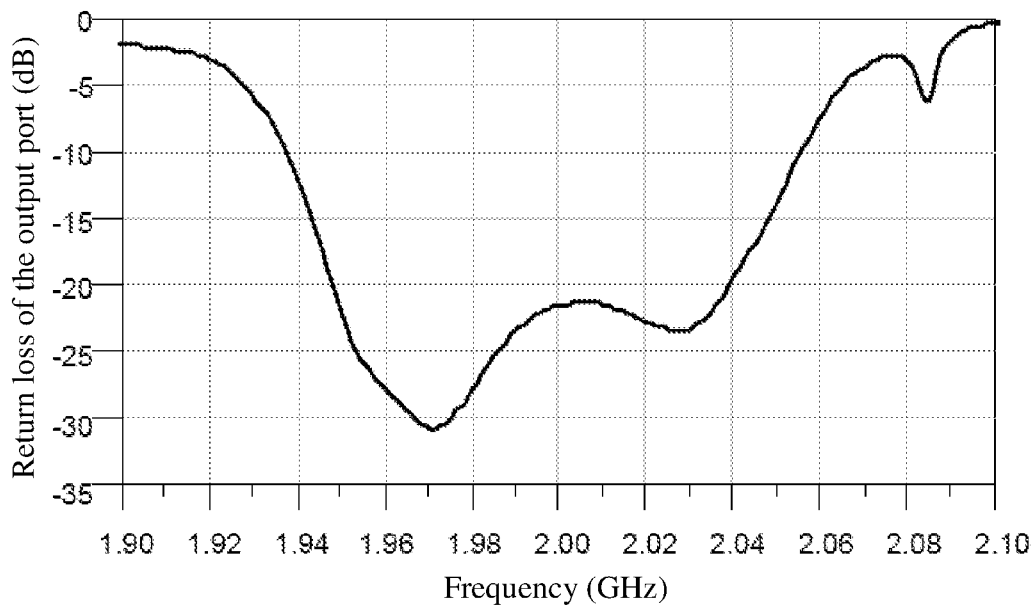
Figure 16A:
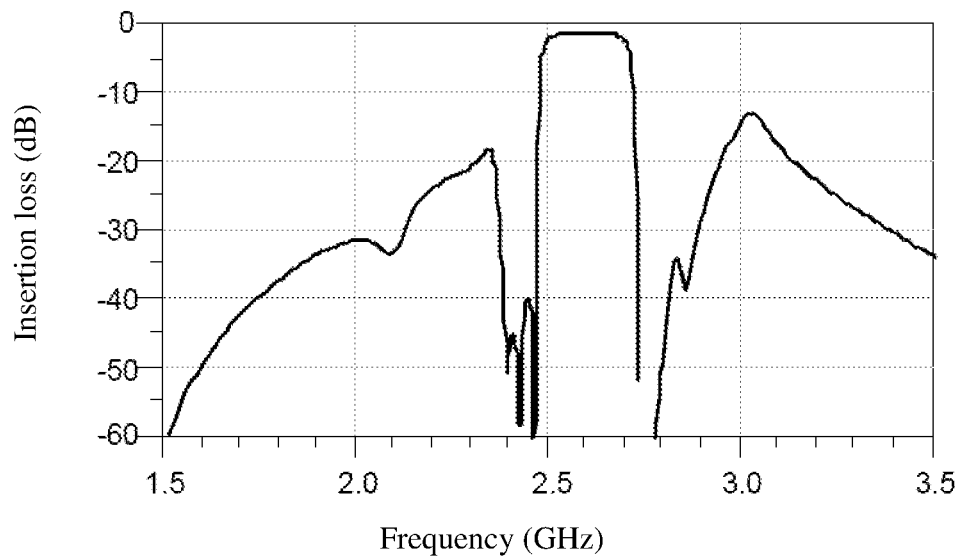
FIG. 16 (a) is a curve of insertion loss of the filter wideband, FIG. 16 (b) is a curve of insertion loss of the filter pass band, FIG. 16 (c) is a curve of return loss of the filter input port, and FIG. 16 (d) is a curve of return loss of the filter output port.
Figure 16B:
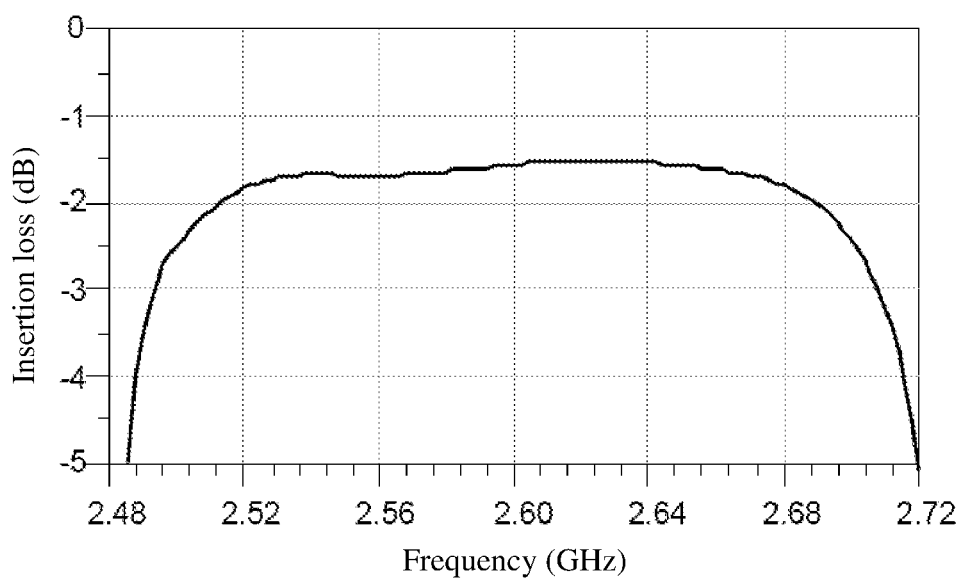
Figure 16C:
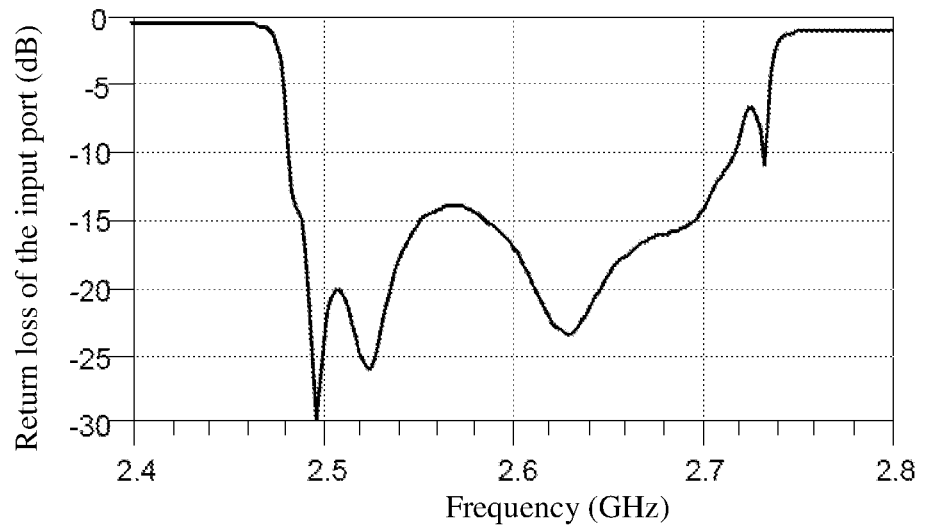
Figure 16D:
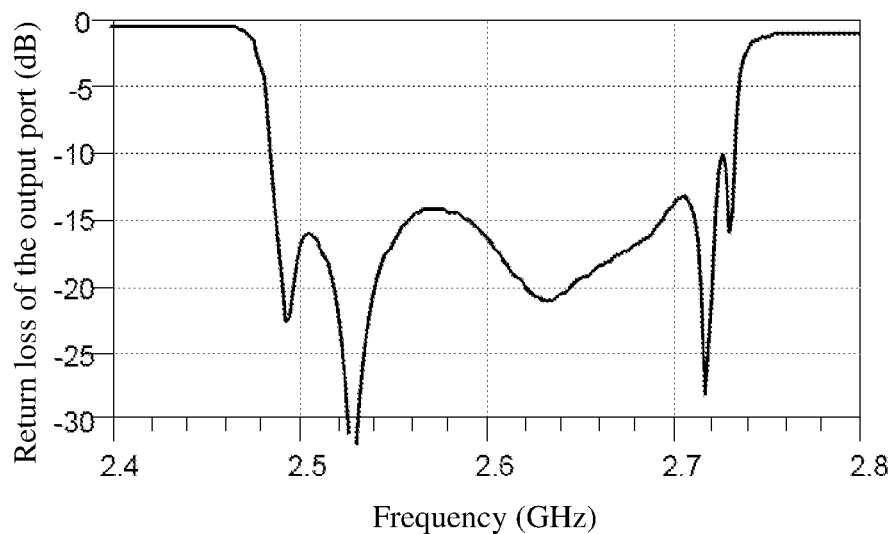

FIG. 10 is a schematic diagram showing a filter 1000 according to another embodiment of the present invention. 1041 is an input terminal of the filter, and 1042 is an output terminal of the filter. Between the input terminal 1041 and the output terminal 1042, there are a plurality of first resonators 1001, 1003, 1004, 1005, 1006 located in the serial path and connected in series and a plurality of second resonators 1011, 1012, 1013, 1014 located in the parallel path and grounded in parallel from some nodes in the serial path. The first resonators 1001, 1003, 1004, 1005, 1006 have a first series resonant frequency $f_{s1}$ and a first parallel resonant frequency $f_{p1}$. The second resonators 1011, 1012, 1013, 1014 have a second series resonant frequency $f_{s2}$ and a second parallel resonant frequency $f_{p2}$. One end of the second resonator 1011 is connected to a node between the first resonators 1001 and 1003, one end of the second resonator 1012 is connected to a node between the first resonators 1003 and 1004, one end of the second resonator 1013 is connected to a node between the first resonators 1004 and 1005 and one end of the second resonator 1014 is connected to a node between the first resonators 1005 and 1006. The other ends of the second resonators 1011 and 1012 are connected together, and the other ends of the second resonators 1013 and 1014 are connected together. In addition, the first resonators 1002, 1007 are respectively connected in parallel to the first resonators 1001, 1006, the first resonators 1002, 1007 also have the first series resonant frequency $f_{s1}$ and the first parallel resonant frequency $f_{p1}$, and the relationship between the resonant frequencies of the first resonator and the second resonator is shown in FIG. 14, wherein $f_{p2}<f_{s1}$.

In addition, the filter 1000 further includes a bandwidth adjustment unit, and the bandwidth adjustment unit includes special parallel ground paths. The special parallel ground paths are led out from a node connected with the first resonators 1003 and 1004 and a node connected with the first resonators 1004 and 1005 in the serial path, one of the special parallel ground paths is comprised of a third resonator 1031 and a first inductor 1025 connected in series and connected to the ground, and the other of the special parallel ground paths is comprised of a third resonator 1032 and a first inductor 1026 connected in series and connected to the ground. A third resonator 1033 is connected in parallel to the third resonator 1032. The third resonators 1031, 1032, 1033 have the same series resonant frequency as that of the first resonator, that is, the first series resonant frequency $f_{s1}$, and have the same parallel resonant frequency as that of the first resonator, that is, the first parallel resonant frequency $f_{p1}$. The first inductors 1025, 1026 have a larger inductance value, typically between 1 nH and 10 nH, and the inductance values of the first inductors 1025, 1026 may be the same or be different. Auxiliary inductors 1021 and 1022 are added in order to connect the first resonator to the input and output terminals of the filter, and auxiliary inductors 1023, 1024 are added in order to connect the second resonators 1011, 1012, 1013, 1014 to the ground. The ends of the second resonators 1011, 1012 that are connected together are connected to the ground via the auxiliary inductor 1023, and the ends of the second resonators 1013, 1014 that are connected together are connected to the ground via the auxiliary inductor 1024. The auxiliary inductors may be bonding wires for connecting the chip to the package carrier, or may also be metal conductors for flip-chip bonding the chip onto the package carrier, such as a copper pillar and a solder ball. The auxiliary inductors 1021, 1022, 1023, 1024 may also be referred to as a second inductor, of which the inductance value is typically in a range from 0.1 nH to 2 nH, such as from 0.1 nH to 0.8 nH. That is, the inductance value of the first inductor is greater than the inductance value of the second inductor. In order to achieve excellent characteristics of the filter throughout the pass-band range, a third inductor 1027 for impedance matching is added near the input terminal 1041, a third inductor 1028 for impedance matching is added near the output terminal 1042, and the device for impedance matching in the filter 1000 is similar to the impedance matching device in the filter 200, which is not repeated any more herein.

FIG. 16(a)-16(d) are diagrams of an amplitude-frequency response curve of insertion loss and return loss of the filter 1000. FIG. 16 (a) is a curve of insertion loss of the filter wideband, FIG. 16 (b) is a curve of insertion loss of the filter pass band, FIG. 16 (c) is a curve of return loss of the filter input port, and FIG. 16 (d) is a curve of return loss of the filter output port. According to an embodiment, the filter 1000 can be used as a filter for the Band 41, wherein the insertion loss of the filter 1000 within the pass band from 2496 MHz to 2690 MHz is less than 2.5 dB while the out-of-band rejection for WLAN (from 2402.5 MHz to 2481.5 MHz) is up to −40 dB, and the out-of-band rejection for LTE-Band 40 is at least −18 dB. As can be seen from the FIG. 16, for the filter 1000, the return loss can still be improved while the bandwidth is increased by the third resonators 1031, 1032, 1033 and the first inductors 1025, 1026, and the out-of-band rejection at the low-frequency side of the pass band is improved, which not only meets the requirements of wideband communications, but also can play a better rejection role on the out-of-band interference signals. Moreover, with the filter 1000 according to an embodiment of the present invention, the relative bandwidth of the filter is enlarged by adding a special parallel ground path under the conditions of neither changing the electromechanical coupling coefficient of the resonator nor changing the complexity of the manufacturing process, and the filter has excellent out-of-band rejection characteristics, thus achieving the high-performance requirements on the piezoelectric filter.

According to the embodiments of the invention, a circuit structure different from the conventional ladder-type is provided, the relative bandwidth of the filter is enlarged by adding a special parallel ground path under the conditions of neither changing the electromechanical coupling coefficient of the resonator nor changing the complexity of the manufacturing process, and the filter has excellent out-of-band rejection characteristics, thus achieving the high-performance requirements on the piezoelectric filter. The filters according to embodiments of the present invention have a bandwidth which exceeds the limit bandwidth of the conventional ladder-type at least by 20%, and the out-of-band rejection does not significantly deteriorate; in particular, the out-of-band rejection at the low-frequency side of the pass band does not significantly deteriorate.

In addition, terms such as "approximate", "similar", "about" or the like appearing in the present invention mean that the results are within an error range commonly recognized by those skilled in the art.

The components of several embodiments are described above so that those skilled in the art can better understand various aspects of the present invention. It should be understood by those skilled in the art that other processes and structures for achieving the same objects and/or achieving the same advantages as those of the embodiments described herein can be designed or changed on the basis of the present invention. It should also be realized by those skilled in the art that such equivalent constructions do not depart from the spirit and scope of the invention, and many changes, substitutions and alterations can be made without departing from the spirit and scope of the invention.

What is claimed is:

1. A filter, comprising:
   a plurality of first resonators connected in series;
   a plurality of second resonators, each of which is connected between ground and one end of one of the plurality of first resonators; and
   a bandwidth adjusting unit connected between the ground and a node between any two of the plurality of first resonators,
   wherein a parallel resonant frequency of the plurality of second resonators is lower than a series resonant frequency of the plurality of first resonators, and
   the bandwidth adjusting unit comprises a third resonator and a first inductor, wherein the third resonator is connected in series with the first inductor, and the third resonator has a different resonant frequency from the parallel resonant frequency of the plurality of second resonators.

2. The filter according to claim 1, wherein one of the plurality of first resonators is connected to an external signal port via a second inductor, and each of the plurality of second resonators is connected to the ground via a third inductor.

3. The filter according to claim 2, wherein the second inductor and the third inductor comprise a bonding wire for connecting a chip to a package carrier, or a metal conductor for flip-chip bonding the chip onto the package carrier.

4. The filter according to claim 3, wherein inductance values of the second inductor and the third inductor are both in a range from 0.1 nH to 2 nH.

5. The filter according to claim 1, further comprising an impedance matching device connected between the ground and an input port or an output port of the filter.

6. The filter according to claim 5, wherein the impedance matching device is a passive device comprising an inductor, a capacitor, or a transmission line, and each of the inductor, the capacitor and the transmission line is implemented by a bonding wire, an integrated passive device (IPD) component, or integrated or discrete devices on a package carrier.

7. The filter according to claim 1, wherein an inductance value of the first inductor is in a range from 1 nH to 10 nH.

8. The filter according to claim 7, wherein all resonators in the plurality of first resonators and the plurality of second resonators in the filter comprise a film bulk acoustic wave piezoelectric resonator (FBAR) having an air gap, a solidly mounted bulk acoustic wave piezoelectric resonator (SMR) having a Bragg acoustic reflector, or a surface acoustic wave piezoelectric resonator (SAWR) with an interdigital transducer (IDT) structure.

9. A filter, comprising:
a plurality of first resonators connected in series;
a plurality of second resonators, each of which is connected between ground and one end of one of the plurality of first resonators; and
a bandwidth adjusting unit connected between the ground and a node between any two of the plurality of first resonators,
wherein a parallel resonant frequency of the plurality of second resonators is lower than a series resonant frequency of the plurality of first resonators, wherein a difference between a series resonant frequency of the plurality of second resonators and the series resonant frequency of the plurality of first resonators is 30% to 80% of a pass-band width of the filter.

10. A filter, comprising:
a plurality of first resonators connected in series;
a plurality of second resonators, each of which is connected between ground and one end of one of the plurality of first resonators; and
a bandwidth adjusting unit connected between the ground and a node between any two of the plurality of first resonators,
wherein a parallel resonant frequency of the plurality of second resonators is lower than a series resonant frequency of the plurality of first resonators, wherein the third resonator has a same resonant frequency as the series resonant frequency of the plurality of first resonators.

* * * * *